United States Patent
Maszara et al.

(10) Patent No.: US 6,486,038 B1
(45) Date of Patent: Nov. 26, 2002

(54) METHOD FOR AND DEVICE HAVING STI USING PARTIAL ETCH TRENCH BOTTOM LINER

(75) Inventors: Witold P. Maszara, Morgan Hill, CA (US); Ming-Ren Lin, Cupertino, CA (US); Qi Xiang, San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 52 days.

(21) Appl. No.: 09/804,360

(22) Filed: Mar. 12, 2001

(51) Int. Cl.[7] .................. H01L 21/76; H01L 21/336; H01L 29/00
(52) U.S. Cl. .................. 438/424; 438/296; 438/444; 438/479; 257/510
(58) Field of Search .................. 438/424, 443, 438/444, 479, 296, 294, 149, 311, 404, 405, 406; 257/510, 524, 347

(56) References Cited

U.S. PATENT DOCUMENTS

| 4,916,086 A | * 4/1990 | Takahashi et al. ........... 438/404 |
| 5,021,359 A | * 6/1991 | Young et al. ............... 438/154 |
| 5,034,789 A | 7/1991 | Black |
| 5,126,817 A | * 6/1992 | Baba et al. ................. 257/347 |
| 5,258,332 A | 11/1993 | Horioka et al. |
| 5,264,395 A | 11/1993 | Bindal et al. |
| 5,279,865 A | 1/1994 | Chebi et al. |
| 5,405,480 A | 4/1995 | Benzing et al. |
| 5,416,041 A | * 5/1995 | Schwalke .................... 438/404 |
| 5,416,048 A | 5/1995 | Blalock et al. |
| 5,445,988 A | * 8/1995 | Schwalke .................... 438/432 |
| 5,470,802 A | 11/1995 | Gnade et al. |
| 5,496,765 A | * 3/1996 | Schwalke .................... 438/404 |
| 5,516,710 A | 5/1996 | Boyd et al. |
| 5,569,058 A | 10/1996 | Gnade et al. |
| 5,578,518 A | 11/1996 | Koike et al. |
| 5,599,722 A | 2/1997 | Sugisaka et al. |
| 5,641,711 A | 6/1997 | Cho |
| 5,646,053 A | 7/1997 | Schepis et al. |
| 5,683,075 A | 11/1997 | Gaul et al. |

(List continued on next page.)

OTHER PUBLICATIONS

Ohno et al., "Experimental 0.25–um–Gate Fully Depleted CMOS/SIMOX Process Using a New Two–Step LOCOS Isolation Technique", 1995 IEEE Trans. on Electron Devices, vol. 42, Issue 8, pp. 1481–1486.*

*Optimized Shallow Trench Isolation Structure and Its Process for Eliminating Shallow Trench Isolation Induced Parasitic Effects*, IBM Technical Disclosure Bulletin, Apr. 1992, pp. 276–277.

*Nanoscale CMOS*, Wong, et al., Proceedings of the IEEE, vol. 87, No. 4, Apr. 1999.

*Primary Examiner*—Matthew Smith
*Assistant Examiner*—Lex H. Malsawma
(74) *Attorney, Agent, or Firm*—Renner, Otto, Boisselle & Sklar, LLP

(57) ABSTRACT

A method of isolation of active islands on a silicon-on-insulator semiconductor device, comprising the steps of (a) providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; (b) etching the silicon active layer to form an isolation trench wherein an unetched silicon layer at bottom of the isolation trench remains; (c) oxidizing the layer of silicon at the bottom of the isolation trench to a degree sufficient to oxidize through the layer of silicon at the bottom to the dielectric isolation layer; and (d) filling the isolation trench with a trench isolation material to form a shallow trench isolation structure.

20 Claims, 4 Drawing Sheets

U.S. PATENT DOCUMENTS

| | | |
|---|---|---|
| 5,741,740 A * | 4/1998 | Jang et al. .................. 438/435 |
| 5,783,476 A | 7/1998 | Arnold |
| 5,807,771 A | 9/1998 | Vu et al. |
| 5,837,612 A | 11/1998 | Ajuria et al. |
| 5,841,171 A * | 11/1998 | Iwamatsu et al. ........... 257/347 |
| 5,863,827 A | 1/1999 | Joyner ........................ 438/425 |
| 5,891,803 A | 4/1999 | Gardner |
| 5,914,280 A * | 6/1999 | Gelzinis .................... 438/734 |
| 5,915,192 A | 6/1999 | Liaw et al. |
| 5,981,402 A | 11/1999 | Hsiao et al. |
| 5,994,756 A | 11/1999 | Umezawa et al. |
| 6,025,269 A | 2/2000 | Sandhu |
| 6,046,106 A | 4/2000 | Tran et al. |
| 6,048,445 A | 4/2000 | Brain |
| 6,054,206 A | 4/2000 | Mountsier |
| 6,057,214 A | 5/2000 | Joyner |
| 6,074,931 A | 6/2000 | Chang et al. |
| 6,077,768 A | 6/2000 | Ong et al. |
| 6,096,612 A | 8/2000 | Houston |
| 6,096,621 A | 8/2000 | Jennings |
| 6,106,678 A | 8/2000 | Shufflebotham et al. |
| 6,110,793 A | 8/2000 | Lee et al. |
| 6,114,741 A | 9/2000 | Joyner et al. |
| 6,118,167 A | 9/2000 | DiSimone et al. |
| 6,118,168 A | 9/2000 | Moon et al. |
| 6,121,148 A | 9/2000 | Bashir et al. |
| 6,124,212 A | 9/2000 | Fan et al. |
| 6,127,242 A | 10/2000 | Batra et al. |
| 6,127,244 A | 10/2000 | Lee |
| 6,130,467 A | 10/2000 | Bandyopadhyay et al. |
| 6,136,713 A | 10/2000 | Chen et al. |
| 6,137,152 A | 10/2000 | Wu |
| 6,146,970 A | 11/2000 | Witek et al. |
| 6,147,402 A | 11/2000 | Joshi et al. |
| 6,150,234 A | 11/2000 | Olsen |
| 6,165,869 A | 12/2000 | Qian et al. |
| 6,171,917 B1 | 1/2001 | Sun et al. |
| 6,171,962 B1 | 1/2001 | Karlsson et al. |
| 6,174,785 B1 | 1/2001 | Parekh et al. |
| 6,268,268 B1 * | 7/2001 | Tokushige .................. 438/439 |
| 6,353,254 B1 * | 3/2002 | Lee et al. ................... 257/510 |
| 6,368,941 B1 * | 4/2002 | Chen et al. ................. 438/424 |

* cited by examiner

METHOD FOR AND DEVICE HAVING STI USING PARTIAL ETCH TRENCH BOTTOM LINER

FIELD OF THE INVENTION

The present invention relates to a method of manufacturing a semiconductor device comprising trench isolation. The invention has particular applicability in manufacturing high density semiconductor devices with submicron design features and active islands isolated by shallow insulated trenches.

BACKGROUND ART

Current demands for high density and performance associated with ultra large scale integration (ULSI) require submicron features of significantly less than 0.25 microns, increased transistor and circuit speeds and improved reliability. Such demands for increased density, performance and reliability require formation of device features with high precision and uniformity.

Conventional semiconductor devices comprise a substrate and various electrically isolated regions, called active islands, in which individual circuit components are formed. The electrical isolation of these active islands is typically accomplished by thermal oxidation of the semiconductor substrate, typically monocrystalline silicon, bounding the active islands. This type of isolation has been referred to as local oxidation of silicon, or LOCOS.

In further reducing the size of semiconductor devices, semiconductor-on-insulator (SOI) wafers increasingly have been used in very-large scale integration (VLSI) or ULSI of semiconductor devices. An SOI wafer typically has a thin layer of silicon on top of a layer of an insulator material. In SOI technology, the semiconductor device is formed entirely in and on the thin layer of silicon, and is isolated from the lower portion of the wafer by the layer of insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

A type of isolation structure is known as trench isolation, wherein shallow isolation trenches are etched in the substrate between the sites of semiconductor devices and an oxide liner is thermally grown on the trench walls. The trench is then refilled with an insulating material. The resulting structure is referred to as a shallow trench isolation (STI) structure. STI has been widely applied to VLSI and ULSI semiconductor devices, and has been applied recently to SOI integrated circuits for such devices.

Trench isolation has several limitations, which may be exacerbated in SOI devices. One problem is that sharp corners at the top of the trench can result in gate leakage currents. More specifically, such sharp corners may cause unwanted increases in the sub-threshold currents in the channel regions along the edge of the device areas when the FETs are switched on. The device threshold voltage can also be lowered. In order to avoid these problems, it has been found desirable to round the corners of such trenches to increase the radius of curvature and thereby decrease the electric field at the corners. This has been accomplished by, for example, oxidizing the entire inner surface of the newly formed trench, taking advantage of the fact that an exposed corner of a silicon layer oxidizes faster than a flat surface of the silicon layer, thus forming a rounded upper corner at the top of the trench.

However, with SOI devices, the corner rounding solution leads to a new problem. The problem in SOI devices arises as a result of the proximity of the dielectric insulation layer below the silicon active layer. In SOI devices, the shallow isolation trench is etched through the silicon layer to the insulation layer. When the exposed portion of the silicon on the sidewalls of the newly formed trench is oxidized during the process of rounding the corners, a wedge or "bird's beak" of new oxide may form on the underside of the silicon active layer adjacent the isolation trench, between the silicon active layer and the underlying layer of insulating material of the SOI wafer. Thus, as the oxide grows on the sidewalls of the trench, it may grow laterally between the lower edge of the silicon active layer and the underlying oxide insulation layer. In essence, during the process of oxidation which is intended to round the upper corner of the silicon active layer, the lower corner of the silicon active layer is also rounded, forming the "bird's beak" between the silicon active layer and the underlying oxide insulation layer. The problem results when growth of the "bird's beak" creates defects in the silicon crystal structure and/or lifts the silicon layer, due to the pressure of the growing oxide. The defects in the crystal structure may change the electrical characteristics of the semiconductor. The lifting of the silicon layer distorts the surface of the semiconductor device from its desired planarity to an undesirable non-planar condition. As semiconductor device dimensions continue to become smaller, problems such as these both occur more easily and become less tolerable.

Thus, there exists a need for STI methodology applicable to SOI semiconductor devices wherein the problems resulting from sharp corners can be alleviated without creating the problems resulting from "bird's beak" on the underside of the silicon active layer adjacent the isolation trench.

SUMMARY OF THE INVENTION

The present invention provides a method of minimizing formation of the "bird's beak" under the silicon island while providing rounded upper corners on the silicon active layer in shallow trench isolation of SOI semiconductor devices.

In one embodiment, the present invention relates to a method of isolation of active islands on a silicon-on-insulator semiconductor device, including the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

etching the silicon active layer to form an isolation trench wherein an unetched silicon layer at bottom of the isolation trench remains;

oxidizing the layer of silicon at the bottom of the isolation trench to a degree sufficient to oxidize through the layer of silicon at the bottom to the dielectric isolation layer; and filling the isolation trench with a trench isolation material to form a trench isolation structure.

In one embodiment, the step of oxidizing results in oxidation of the silicon on sidewalls of the isolation trench. In one embodiment, the trench oxide liner and the dielectric isolation layer form an integral isolation structure for and define an active island.

In another embodiment, the present invention relates to a method of isolation of active islands on a silicon-on-insulator semiconductor device, comprising the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

etching the silicon active layer to form an isolation trench wherein an unetched silicon layer at bottom of the isolation trench remains;

oxidizing exposed silicon on sidewalls of the isolation trench and in the unetched silicon layer at the bottom of the isolation trench so as to electrically isolate from one another portions of the silicon active layer separated by the isolation trench and to round corners on an upper portion of the silicon active layer; and filling the isolation trench with a trench isolation material.

In another embodiment, the present invention relates to a silicon-on-insulator semiconductor device, comprising:

a silicon-on-insulator wafer having a silicon active layer, a dielectric isolation layer a silicon substrate, and at least one isolation trench defining an active island in the silicon active layer, in which the silicon active layer is formed on the dielectric isolation layer and the dielectric isolation layer is formed on the silicon substrate;

wherein the at least one isolation trench includes a trench bottom liner which is an oxide formed from an unetched silicon layer in a lower portion of the isolation trench.

In one embodiment, the isolation trench above the trench bottom liner is filled with a trench isolation material. In one embodiment, the dielectric isolation layer, the trench bottom liner and the trench isolation material each comprise silicon dioxide. In one embodiment, the trench bottom liner is in contact with the dielectric isolation layer. In one embodiment, the dielectric isolation layer, the trench bottom liner, the trench isolation material and a sidewall oxide liner each comprise silicon dioxide.

Thus, the present invention provides methods of STI applicable to SOI semiconductor devices which do not suffer from problems resulting from formation of a "bird's beak" on the underside of the silicon active layer adjacent the isolation trench, while still allowing formation of isolation trenches which provide for complete electrical isolation of adjacent active islands in the SOI wafer.

DETAILED DESCRIPTION

The method of the present invention may be applied to a silicon-on-insulator (SOI) semiconductor wafer at any time subsequent to the formation of a silicon-on-insulator (SOI) wafer. In one embodiment, the method is applied immediately following fabrication of the SOI wafer. In one embodiment, the method is applied following fabrication of the SOI wafer and fabrication of at least some of the elements of a semiconductor device on the SOI wafer.

Figure 1:
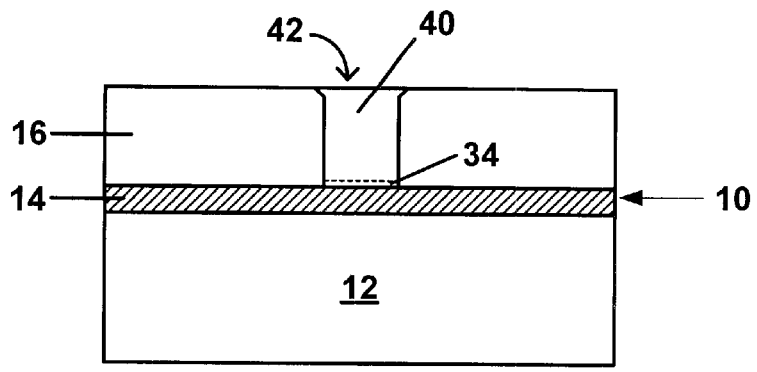
FIG. 1 is a partial cross-sectional view of one embodiment of an SOI wafer following formation of a shallow trench isolation structure, in accordance with the present invention.

The present invention relates to an SOI wafer including a shallow trench isolation (STI) structure between active islands, in which the STI structure includes a layer of fully oxidized silicon active layer at the bottom of the STI trench formed by oxidation of a layer of unetched silicon left during the STI trench formation etching step. FIG. 1 is a partial cross-sectional view of an SOI wafer 10 following formation of a shallow isolation trench including a layer of oxidized silicon active layer as a trench bottom liner, in accordance with the present invention. The SOI wafer 10 shown in FIG. 1 includes a substrate 12, a dielectric isolation material layer 14 and an active silicon layer 16. The SOI wafer 10 shown in FIG. 1 further includes an STI structure 42 which is formed of a trench isolation material 38 which includes a layer of oxidized silicon active layer 40 formed from the unetched silicon layer 28.

Figure 10:
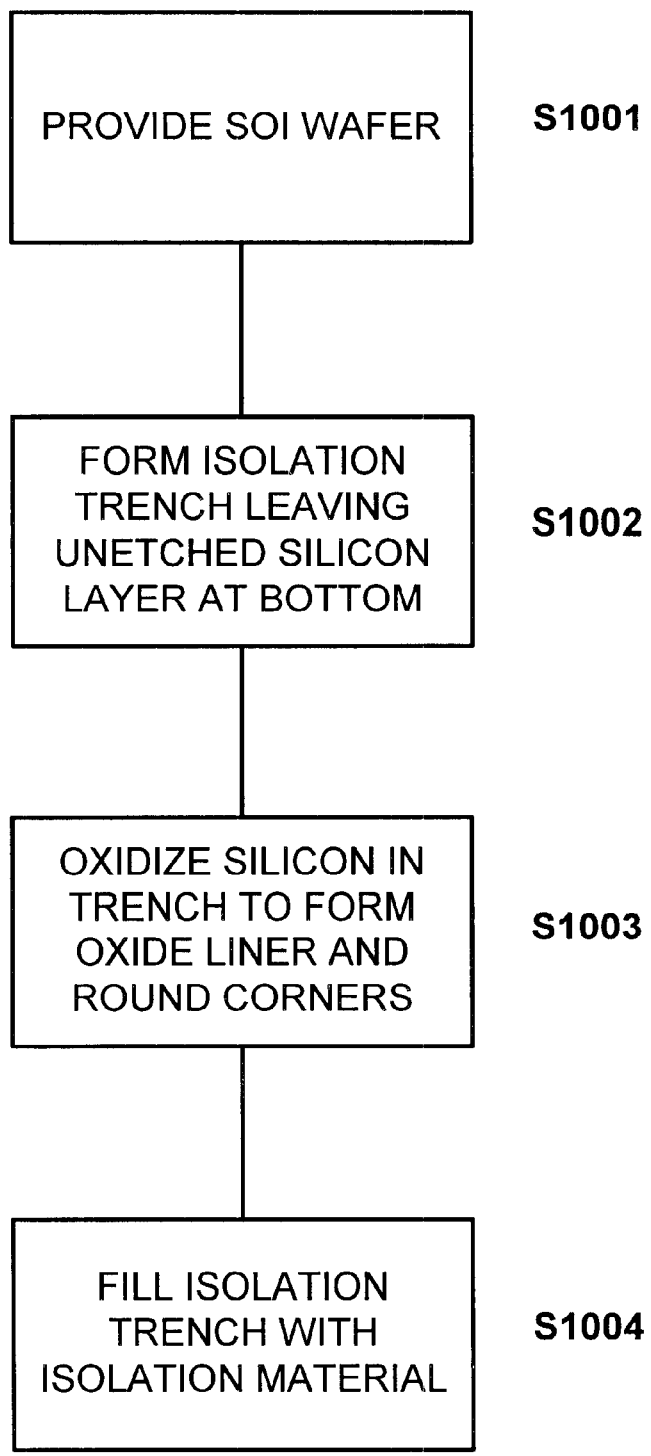
FIG. 10 is a flow diagram of one embodiment of a method of isolation of active islands on a SOI wafer.

The present invention further relates to a method of isolation of active islands on a SOI semiconductor device. FIG. 10 is a flow diagram of one embodiment of a method of isolation of active islands on a SOI wafer. In the first step of the method, shown in FIG. 10 as step S1001, a SOI semiconductor wafer having a silicon active layer, a dielectric isolation layer and a silicon substrate is provided. In one embodiment, the silicon active layer is formed on the dielectric isolation layer and the dielectric isolation layer is formed on the silicon substrate. In one embodiment, the silicon active layer is a monocrystalline silicon. As used herein, the term "monocrystalline" means a crystal lattice structure substantially without defects in the crystal structure and containing few impurities.

Figure 2:
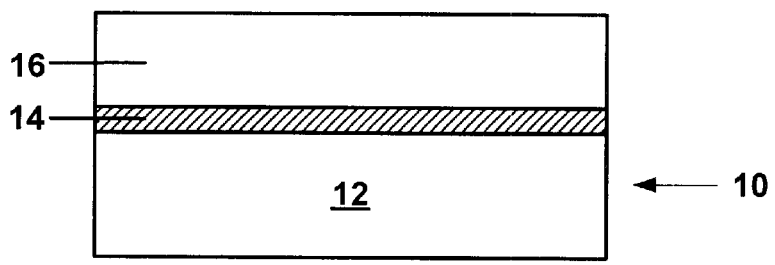
FIG. 2 is a partial cross-sectional view of an SOI wafer.

FIG. 2 shows a partial cross-sectional view of an SOI wafer 10, with a silicon substrate 12, a buried oxide layer 14 and a silicon active layer 16. The silicon active layer 16 may include one or more semiconductor devices. The silicon active layer 16 may be a part of a newly fabricated SOI wafer, in which semiconductor devices have not yet been fabricated. In one embodiment, the silicon active layer 16 is part of an SOI wafer in which a plurality of semiconductor devices have been formed, or are in the process of being formed. In such embodiment, the silicon active layer 16 includes at least one semiconductor device element. The SOI wafer shown in FIG. 2 is only a small portion of a much larger SOI wafer, of which the silicon active layer 16 will be divided into a plurality of active islands, which may be isolated one from another by application of the method of the present invention. As will be understood by those of skill in the art, although a cross-sectional view of a single isolation structure is shown in the drawings of and described in the present disclosure, the method is applicable to formation of a plurality of such isolation structures simultaneously.

The SOI wafer 10 used in the present invention may be any SOI wafer formed by any of the techniques known in the art for forming SOI wafers, or by any other method of forming SOI wafers. The present invention, as described herein, is applied to a previously formed SOI wafer, and thus is not limited to any particular method of forming the SOI wafer.

In the second step of the method of the present invention, shown in FIG. 10 as step S1002, an isolation trench is formed by etching the silicon active layer in selected areas so as to leave a layer of silicon from the silicon active layer unetched at the bottom of the isolation trench.

Figure 3:
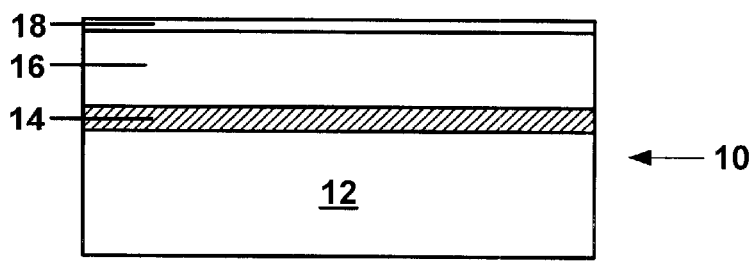
FIG. 3 is a partial cross-sectional view of an SOI wafer following application of a pad oxide layer.
Figure 4:
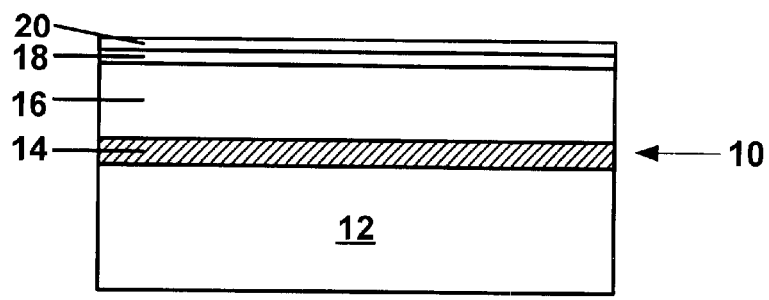
FIG. 4 is a partial cross-sectional view of an SOI wafer following application of a hard mask layer over a pad oxide layer.
Figure 5:
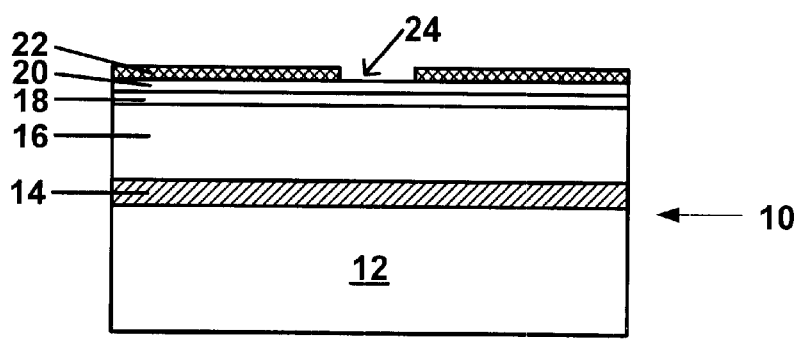
FIG. 5 is a partial cross-sectional view of an SOI wafer following application of a patterned photoresist layer over a hard mask layer and pad oxide layer.
Figure 6:
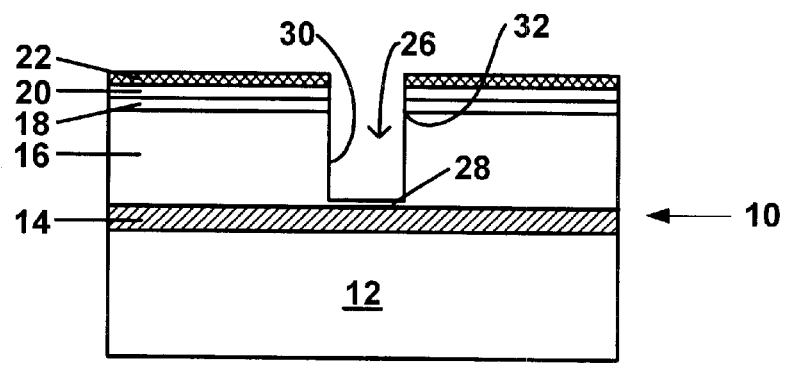
FIG. 6 is a partial cross-sectional view of the SOI wafer of FIG. 5 following one or more steps of etching to form an isolation trench, including an unetched silicon layer at the bottom of the isolation trench.

A typical method of trench formation is shown in FIGS. 2–6. A typical method of trench formation comprises initially growing a pad oxide layer 18 on the substrate, as shown in FIG. 3. A nitride layer 20 is then deposited over the pad oxide 18, as shown in FIG. 4. A photoresist mask 22 is then applied to define the trench areas, as shown in FIG. 5. The exposed portions of the nitride layer 20 are then etched away, followed by etching away of the exposed pad oxide layer 18. The etching continues into the thus-exposed substrate to form the shallow trench, such as is shown in FIG. 6, except as noted below. When etching of the trench is completed, the photoresist is stripped off the remaining nitride layer.

The isolation trench of the present invention may be formed by a series of conventional steps, as will be recognized upon review of FIGS. 2–6, except that the trench-forming etching is terminated prior to "etch through" of the silicon at the bottom of the isolation trench, when the etching would otherwise etch through a final portion of the silicon active layer and reach the underlying dielectric isolation layer, as shown in FIG. 6. The etching process is controlled in the present invention so as to terminate the etching process at a selected time when a layer of silicon from the silicon active layer remains at the bottom of the trench. The steps of forming the isolation trench of the present invention are conventional, up to the point of terminating the etching process at the selected time when a layer of unetched silicon remains at the bottom of the trench.

An isolation trench 26 formed in accordance with the present invention is shown in FIG. 6. As shown in FIG. 6, the isolation trench 26 does not reach the underlying dielectric isolation layer 14, but instead when the etching step is terminated an unetched silicon layer 28 remains at the bottom of the isolation trench 26. In other words, the etching step is terminated when "etch through" to the underlying dielectric isolation layer 14 has not occurred. Any method known in the art for etching the various layers which have been applied over the silicon active layer 16 of the SOI wafer 10 may be used to form the isolation trench 26, provided the etching can be terminated at a selected time when the unetched silicon layer 28 remains at the bottom of the trench 26, as shown in FIG. 6.

The thickness of the unetched silicon layer 28 is predetermined to provide a barrier sufficient to avoid formation of a bird's beak, as described above. In one embodiment, the thickness of the unetched silicon layer 28 is selected such that, when the unetched silicon layer 28 is subsequently oxidized, the thickness of a resulting trench bottom liner in the bottom of the isolation trench 26 is the same as the thickness of a sidewall oxide liner formed during the oxidation step.

Figure 7:
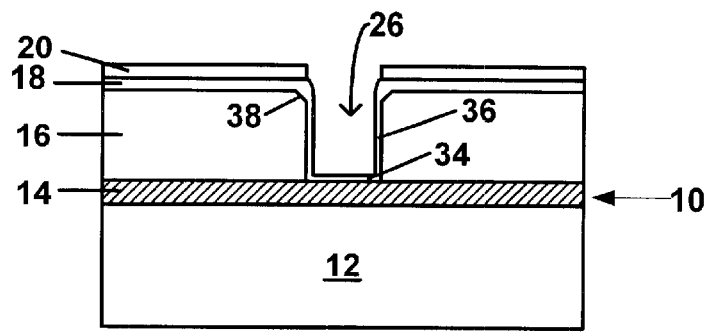
FIG. 7 is a partial cross-sectional view of one embodiment of an SOI wafer in which the unetched silicon layer and the sidewalls have been oxidized to form a trench liner, and the upper square corners of the silicon active layer have been rounded.

In the third step of the method of the present invention, shown in FIG. 10 as step S1003, the unetched silicon layer 28 at the bottom of the isolation trench 26 is oxidized to a degree sufficient to fully oxidize the silicon of the unetched silicon layer 28 at the bottom of the isolation trench through to the underlying dielectric isolation layer 14, and to round the upper square corners 32 shown in FIG. 6, to form the structure of the SOI wafer 10 shown in FIG. 7. This oxidation step forms a trench bottom liner 34 from the unetched silicon layer 28, which originally was part of the silicon active layer 16. In one embodiment, the entire thickness across the entire width of the unetched silicon layer 28 at the bottom of the isolation trench 26 is oxidized through in forming the trench bottom liner 34, thus electrically isolating the active islands on either side of the isolation trench 26 from each other. In one embodiment, at least a portion of the unetched silicon layer 28 at the bottom is oxidized through to the underlying dielectric isolation layer 14 in forming the trench bottom liner 34, thus electrically isolating the active islands on either side of the isolation trench 26 from each other.

In one embodiment, the oxidation step forms a trench sidewall liner 36, as shown in FIG. 7. In one embodiment, the oxidation step simultaneously forms both the trench bottom liner 34 and the trench sidewall liner 36.

The trench bottom liner 34 and the trench sidewall liner 36 are both formed by oxidation of silicon which was originally part of the silicon active layer 16. In the following descriptions, the term "trench oxide liner" is used to refer collectively to the trench bottom liner 34 and the trench sidewall liner 36. When the term "trench oxide liner" is used, it is understood that reference is made to both the trench bottom liner 34 and the trench sidewall liner 36. When either of these structures are referred to individually, the individual structure is specifically identified.

In one embodiment, the SOI wafer 10 of FIG. 6 is oxidized in a single isotropic oxidation to form an SOI wafer 10 such as that shown in FIG. 7. Such an isotropic oxidation may be a thermal oxidation, which may be carried out in an oxygen-containing atmosphere at a temperature of about 1000° C. FIG. 7 shows an embodiment of the SOI wafer 10 in which the unetched silicon layer 28 and the sidewalls 30 have been oxidized to form a trench oxide liner comprising the trench bottom liner 34 and the trench sidewall liner 36, and in which the upper corners 32 of the silicon active layer have been rounded to form the rounded corners 38. In the embodiment shown in FIG. 7, the trench bottom liner 34 obtained by oxidation of the unetched silicon layer 28 at the bottom is substantially the same thickness as the trench sidewall liner 36 obtained by oxidation of the sidewalls 30. The trench oxide liner in FIG. 7 has a substantially uniform thickness on both its sidewall portions and its bottom portion. In this embodiment, the isotropic oxidation results in oxidation of the unetched silicon layer 28 at the bottom of the isolation trench 26 such that the trench bottom liner 32 reaches the underlying dielectric isolation layer 14 across its full width, as shown in FIG. 7.

The oxidation of the unetched silicon layer 28 is carried out simultaneously with oxidation of the sidewalls 30 to form a trench liner. In this embodiment, when the trench oxide liner thicknesses are desired to be different, the oxidation may be an anisotropic oxidation, in which the oxidation of the unetched silicon layer 28 proceeds at a more rapid rate than the oxidation of the silicon on the sidewalls 30. In one embodiment, such an anisotropic oxidation may be a reactive ion oxidation, in which reactive oxygen ions are directed into the isolation trench 26 from above, as a result of which the unetched silicon layer 28 receives a greater quantity of reactive oxygen ions than the sidewalls 30 and is therefore oxidized more rapidly than the sidewalls 30. In one embodiment, such an anisotropic oxidation may be a plasma-assisted oxidation, in which a plasma is directed downwardly into the isolation trench 26, resulting in a lesser degree of oxidation of the sidewalls 30 than of the unetched silicon layer 28. Thus, the thickness of the sidewall oxide liner 36 may be less than the thickness of the trench bottom oxide liner 34.

In carrying out the oxidation of the unetched silicon layer 28 and the sidewalls 30, at least one rounded upper corner 38 of the silicon active layer is formed. Corner rounding has been found useful in avoiding undesired electronic effects resulting from sharp corners in the silicon active layer 16.

FIG. 7 shows an embodiment in which the trench oxide liner includes a trench bottom liner 34, a trench sidewall liner 36 and rounded corners 38. In one embodiment, these three structures are formed simultaneously. Thus, in one embodiment, the oxidizing step includes forming the trench oxide liner 34,36 in the isolation trench 26 and rounding the square upper corners 32 to form the rounded upper corners 38.

In one embodiment, the trench oxide liner is silicon dioxide, the pad oxide layer 18 is silicon dioxide and these two elements form a combined structure in which the two materials are joined and in which there is no definite line of separation between them, although they have been formed in separate, different steps. The embodiment shown in FIG. 7 is a schematic depiction of such an embodiment, since there is no clear demarcation between the parts.

In the fourth step of the method of the present invention, shown in FIG. 10 as step S1004, the isolation trench is filled with a trench isolation material. The trench isolation material may be any material known in the art for use as an isolation material for shallow trench isolation in semiconductor devices. The present method is not limited to any particular trench isolation material.

Figure 8:
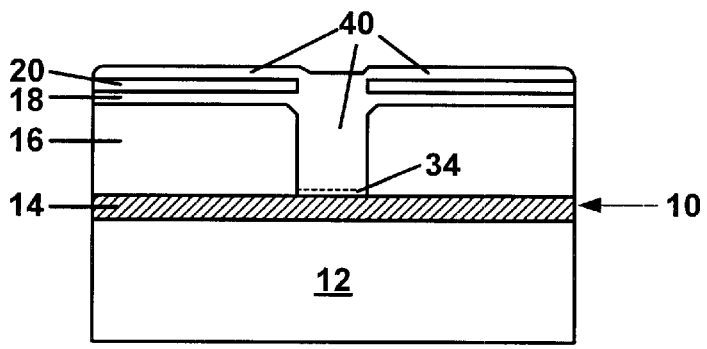
FIG. 8 is a partial cross-sectional view of an embodiment of an SOI wafer following a step of filling the isolation trench with an isolation material.

As shown in FIG. 8, in one embodiment, a trench isolation material 40 is applied so as to cover the outer surface of the SOI wafer 10 as well as to fill the isolation trench 26. The isolation trench 26 is thus filled from a level beginning at the upper surface of the trench bottom liner 34 to a level above the silicon active layer 16, the pad oxide layer 18 and the hard mask layer 20

Figure 9:
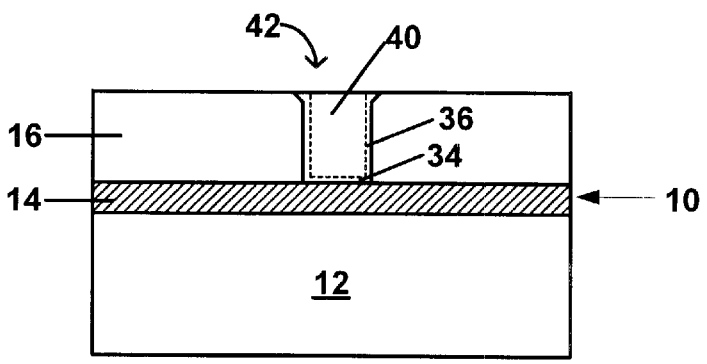
FIG. 9 is a partial cross-sectional view of another embodiment of an SOI wafer following formation of a shallow isolation trench, in accordance with the present invention, similar to that of FIG. 1.

The trench isolation material 40, shown in FIGS. 1, 8 and 9, may be formed of any material known in the art. In one embodiment, the trench isolation material 40 is an oxide of silicon. In one embodiment, the trench isolation material 40 is silicon dioxide, $SiO_2$. The trench isolation material may comprise other dielectric materials, such as SiON, which can provide the function of electrically insulating adjacent active islands on an SOI wafer from each other, and which may be deposited by a convenient method. The trench isolation material 40, shown in FIG. 8, may be deposited in the isolation trench 26 by any method known in the art.

Following deposition of the trench isolation material 40, excess material is removed from the SOI wafer 10, to produce a SOI wafer 10 as shown in FIG. 1, in which respective silicon active layers 16 of adjacent active islands have been separated by a shallow trench isolation (STI) structure 42. The STI structure 42 shown in FIG. 1 is formed of the trench isolation material 40 and the trench oxide liner 34,36.

The excess material which is removed from the SOI wafer includes any layers applied in carrying out the method of the present invention, such as the pad oxide layer 18 and the hard mask layer 20, and any excess trench isolation material 40. These layers and any other excess materials are removed by techniques known in the art, such as by etching and/or chemical mechanical polishing (CMP).

FIG. 9 shows an embodiment of the SOI wafer 10 obtained by the method of the present invention similar to that shown in FIG. 1. As shown in FIG. 9, in an embodiment in which the shallow trench isolation structure 42 (which includes the trench isolation material 40 and the trench oxide liner, which in turn includes the trench bottom liner 34 and the trench sidewall liner 36) and the dielectric isolation layer 14 are all formed of the same material or are formed of substantially similar materials, such as silicon dioxide. As depicted in FIG. 9, these structures may form a combined structure in which the parts are not easily distinguishable from each other, although they were formed by different process steps at different times in the method of the present invention. The SOI wafer 10 shown in FIGS. 8 and 9 are a schematic representations of such a structure, in which the separate parts are not distinctly separated, but are different, as indicated by the dashed lines representing the portion of the trench isolation structure 40 derived from the oxidized unetched silicon layer 34. As shown in FIG. 9, dashed lines indicate that both the sidewall oxide liner 36 and the trench bottom liner 34 are formed of a material which is distinguishable from the trench fill material. In one embodiment, the trench isolation material 40, which was formed by a deposition method, such as CVD or PECVD, differs from the trench oxide liner 34,36, which was formed by oxidation, and these materials are chemically distinguishable from each other. In one embodiment, the trench isolation material 40, the trench oxide liner 34,36 and the dielectric isolation layer 14 are all silicon dioxide. In one embodiment, the silicon active layer 16 has been doped, for example, n-doped, the oxidation product obtained by oxidation of this doped silicon is different from, for example, a CVD-deposited silicon dioxide derived from silane, $SiH_4$ and oxygen, $O_2$, in which no dopant is included.

Following the filling step, the SOI wafer may be further processed by, e.g., removing excess material such as the pad oxide layer, the hard mask layer and excess trench isolation material, from the surface of the SOI wafer. Following the steps of the present invention, the SOI wafer may be further processed in the fabrication of semiconductor devices in a known manner.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of isolation of active islands on a silicon-on-insulator semiconductor device, comprising the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

etching the silicon active layer to form an isolation trench wherein an unetched silicon layer remains at bottom of the isolation trench;

oxidizing the layer of silicon at the bottom of the isolation trench to a degree sufficient to oxidize through the layer of silicon at the bottom to the dielectric isolation layer; and filling the isolation trench with a trench isolation material to form a shallow trench isolation structure, further comprising a step of oxidizing silicon on sidewalls of the isolation trench.

2. The method of claim 1, wherein the step of oxidizing silicon on sidewalls occurs substantially simultaneously with the step of oxidizing the unetched silicon layer at the bottom of the isolation trench.

3. The method of claim 2, wherein the steps of oxidizing result in formation of a trench oxide liner which is thicker at the bottom than at the sidewalls of the isolation trench.

4. The method of claim 1, wherein the steps of oxidizing silicon on the sidewalls and the bottom form a trench oxide liner in the isolation trench.

5. The method of claim 4, wherein the trench oxide liner and the dielectric isolation layer form an integral isolation structure for and define an active island.

6. The method of claim 5, wherein the trench oxide liner and the dielectric isolation layer are formed of silicon dioxide.

7. The method of claim 1, wherein the step of oxidizing silicon on sidewalls of the isolation trench rounds corners on an upper portion of the silicon active layer.

8. The method of claim 1, wherein the isolation trench has a width and the step of oxidizing continues to a degree sufficient to oxidize through the unetched silicon layer at the bottom to the dielectric isolation layer fully across the width of the isolation trench.

9. A method of isolation of active islands on a silicon-on-insulator semiconductor device, comprising the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

etching the silicon active layer to form an isolation trench wherein an unetched silicon layer remains at bottom of the isolation trench;

oxidizing exposed silicon on sidewalls of the isolation trench and in the unetched silicon layer at the bottom of the isolation trench so as to electrically isolate from one another portions of the silicon active layer separated by the isolation trench and to round corners on an upper portion of the silicon active layer; and filling the isolation trench with a trench isolation material to form a shallow trench isolation structure.

10. The method of claim 9, wherein the isolation trench has a width and the step of oxidizing continues to a degree sufficient to oxidize through the unetched silicon layer at the bottom to the dielectric isolation layer fully across the width of the isolation trench.

11. The method of claim 9, wherein the step of oxidizing comprises differential oxidation of the sidewalls and the bottom, whereby the oxide liner formed is thicker at the bottom than at the sidewalls of the isolation trench.

12. The method of claim 9, wherein the shallow trench isolation structure and the dielectric isolation layer form an integral isolation structure for and define an active island in the silicon active layer.

13. The method of claim 9, wherein the oxidizing step substantially simultaneously oxidizes the sidewalls and the unetched silicon layer.

14. A silicon-on-insulator semiconductor device, comprising:

a silicon-on-insulator wafer having a silicon active layer, a dielectric isolation layer a silicon substrate, and at least one isolation trench defining an active island in the silicon active layer, in which the silicon active layer is formed on the dielectric isolation layer and the dielectric isolation layer is formed on the silicon substrate;

wherein the at least one isolation trench includes a trench bottom liner which is an oxide formed from an unetched silicon layer in a lower portion of the isolation trench, further comprising a sidewall oxide liner formed from silicon on a sidewall of the isolation trench.

15. The silicon-on-insulator semiconductor device of claim 14, wherein the isolation trench above the trench bottom liner is filled with a trench isolation material.

16. The silicon-on-insulator semiconductor device of claim 15, wherein the dielectric isolation layer, the trench bottom liner and the trench isolation material each comprise silicon dioxide.

17. The silicon-on-insulator semiconductor device of claim 14, wherein the trench bottom liner is in contact with the dielectric isolation layer.

18. The silicon-on-insulator semiconductor device of claim 11, wherein the trench bottom liner and the sidewall oxide liner are formed of oxidized silicon from the silicon active layer and the trench isolation material is formed by a deposition method.

19. The silicon-on-insulator semiconductor device of claim 14, wherein the trench bottom liner is thicker than the sidewall oxide liner.

20. The silicon-on-insulator semiconductor device of claim 14, wherein the trench bottom liner extends substantially fully across a width of the isolation trench.

* * * * *

UNITED STATES PATENT AND TRADEMARK OFFICE
CERTIFICATE OF CORRECTION

PATENT NO. : 6,486,038 B1
DATED : November 26, 2002
INVENTOR(S) : Maszara et al.

It is certified that error appears in the above-identified patent and that said Letters Patent is hereby corrected as shown below:

Column 10,
Line 46, replace "claim 11" with -- claim 14 --

Signed and Sealed this

Twenty-ninth Day of April, 2003

JAMES E. ROGAN
*Director of the United States Patent and Trademark Office*